(12) United States Patent
Guerra et al.

(10) Patent No.: US 8,279,000 B2
(45) Date of Patent: Oct. 2, 2012

(54) RADIO-FREQUENCY AMPLIFIER

(75) Inventors: Ranieri Guerra, S. Giovanni la Punta (IT); Giuseppe Palmisano, S. Giovanni la Punta (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 0 days.

(21) Appl. No.: 12/959,983

(22) Filed: Dec. 3, 2010

(65) Prior Publication Data

US 2011/0133842 A1 Jun. 9, 2011

(30) Foreign Application Priority Data

Dec. 4, 2009 (IT) .............................. VA2009A0080

(51) Int. Cl.
*H03F 1/34* (2006.01)
(52) U.S. Cl. ........................................................ 330/85
(58) Field of Classification Search .................. 330/85, 330/86, 291
See application file for complete search history.

(56) References Cited

U.S. PATENT DOCUMENTS

| | | | |
|---|---|---|---|
| 7,317,351 B2* | 1/2008 | Taylor ............................. | 330/85 |
| 7,622,989 B2* | 11/2009 | Tzeng et al. .................. | 330/126 |
| 2004/0239430 A1 | 12/2004 | Cosentino et al. ............ | 330/311 |

FOREIGN PATENT DOCUMENTS

DE 3610252 10/1987

OTHER PUBLICATIONS

Castello et al., "Multimode reconfigurable wireless terminals: a first step toward software defined radio" IEEE, Sep. 2006, pp. 42-49.
Gao et al., "A fully integrated CMOS active bandpass filter for multiband RF front-ends", IEEE, Aug. 2008, pp. 718-722.
Liu et al., "A 0.9mW 0.01-14 GHz wideband CMOS low noise amplifier for low-band ultra wideband applications", IEEE, Nov. 2005, pp. 345-348.
Maxim et al., A fully integrated 0.13 CMOS low-IF DBS satellite tuner using automatic signal-path gain and bandwidth calibration, IEEE, vol. 42, No. 4, Apr. 2007, pp. 897-921.
Saleh et al., "A low-power differential common-gate LNA", IEEE, Aug. 2008, pp. 137-140.

* cited by examiner

*Primary Examiner* — Steven J Mottola
(74) *Attorney, Agent, or Firm* — Allen, Dyer, Doppelt, Milbrath & Gilchrist, P.A.

(57) ABSTRACT

A radio-frequency amplifier includes a common gate amplification stage configured to be biased in a saturation condition with a first current and configured to receive an input signal as a gate-source voltage and to generate an output voltage as an amplified replica of the input signal. A feedback transistor is configured to be biased in a saturation condition with a second current and coupled to the common gate amplification stage so as to have a gate-drain voltage corresponding to a difference between the output voltage and the input signal.

15 Claims, 5 Drawing Sheets

RADIO-FREQUENCY AMPLIFIER

FIELD OF THE INVENTION

This invention relates, in general, to amplifiers, and, more particularly, to an architecture of an integrable radio-frequency amplifier having a reduced input resistance, and a high gain with a low noise figure in a large frequency interval.

BACKGROUND OF THE INVENTION

Radio-frequency transceivers, as the one shown in FIG. 1, include a transmitter TX and a receiver RX of a radio-frequency signal RF modulated on a carrier LO. The receiver circuit should be capable of amplifying and converting to base-band (BB) the fable antenna signal without excessively degrading its noise-to-signal ratio (S/N).

The first amplification stage—commonly called a Low Noise Amplifier (LNA)—is particularly critical because, besides properly amplifying the input radio-frequency signal, it is desired that it satisfy specifications of impedance matching with the antenna or eventual filters, and degrading as less as possible the input S/N ratio.

Another restraint of great importance, especially in portable devices, is tied to the limited availability of energy for powering the system, which typically implies a limitation of available current for powering the functional blocks, including the LNA. Typically, attendant to a low consumption design is a reduction of the gain of the functional circuits and an increased influence of internally generated noise.

Moreover, low noise amplifiers disclosed in literature are designed for satisfying gain specifications, noise and impedance matching on relatively narrow bands. Typically, they use a certain number of reactive components, that are often external components. This makes these known circuits scarcely flexible, relatively encumbering and expensive.

The need of low noise circuits strongly limits complexity of topologies and the number of components that may be used to make the LNA. For this reason, numerous approaches disclosed in literature are based on common source (CS) or common gate (CG) amplification stages. Typically, CS configurations have a comparably better noise performance and implement the desired impedance matching by using reactive components (inductors and capacitors) that typically lead to a narrow band circuit, hardly realizable in completely integrated form.

CG architectures, though in general have a poorer noise performance than CS architectures, may be used over broader frequency bands because the amplification stage has an input impedance with a finite real part and a minimum noise figure $F_{min}$ that are both independent from the working frequency.

Another common gate amplification stage is illustrated in FIG. 2. Vin is the input signal that is effectively amplified, $V_{sig}$ is the signal captured by the antenna, and $R_S$ the internal resistance of the antenna. By neglecting the effects of the input capacitance, the maximum power transfer from the antenna to the amplification stage is for $r_{in}=R_S$ wherein $r_{in}$ is the real part of the input impedance of the antenna $Z_{in}$. Given that:

$$r_{in} \approx \frac{1}{g_{M1}} \text{ and } g_{M1} = 2\overline{|k|}\frac{W}{L} I_{B1}$$

wherein $g_{M1}$ is the transconductance of the transistor M1 and W/L is the aspect ratio, this condition is relatively restrictive, especially for a low consumption design.

If the bias current $I_{B1}$ is limited to a value of about one mA and if $R_S=50\Omega$, the condition $r_{in}=R_S$ is practically not realizable because the value of $g_{M1}$ that would satisfy this condition is not compatible with the level of $I_{B1}$ and with aspect ratios W/L of the transistors adapted to the common working frequencies. Indeed, a large size of the transistor M1 implies a high capacitance, thus the reactive (capacitive) part $Z_{in}$ would no longer be negligible.

A known architecture that partially obviates to the issues connected with a large aspect ratio W/L of M1, in case of a limited bias current $I_{B1}$, is shown in FIG. 3. The circuit includes an inductor $L_S$ that compensates the capacitive portion of the input impedance $Z_{in}$, and a reactive network MATCHING NETWORK for matching the input impedance $r_{in}\approx 1/g_{M1}$ (typically of the order of several hundreds of Ohms) with the resistance $R_S$.

This approach, besides using hardly integrable inductive components or components of poor quality, that make it more expensive and less practical, jeopardizes the capability of functioning, in the desired manner over a broad band, which is the characteristic of common gate amplifiers.

SUMMARY OF THE INVENTION

An architecture of a radio-frequency amplifier that overcomes the limitations and drawbacks of the above mentioned amplifiers has been found. The architecture is based on a common gate amplification stage, and a feedback transistor, the gate-drain voltage of which corresponds to the difference between the amplified output voltage and the voltage that is effectively input to the radio-frequency amplifier.

The proposed architecture is totally integrable, and compared with the prior art, has a reduced input resistance for the same voltage gain over a relatively broad frequency band. Moreover, the amplifier does not require particularly large aspect ratio of transistors nor large bias currents.

DETAILED DESCRIPTION OF THE PREFERRED EMBODIMENTS

The proposed architecture of a radio-frequency amplifier overcomes both gain and impedance matching limitations over a wide frequency band, in low consumption conditions, without using external components and with limited noise figures, given the reduced complexity of the circuit.

Figure 1:
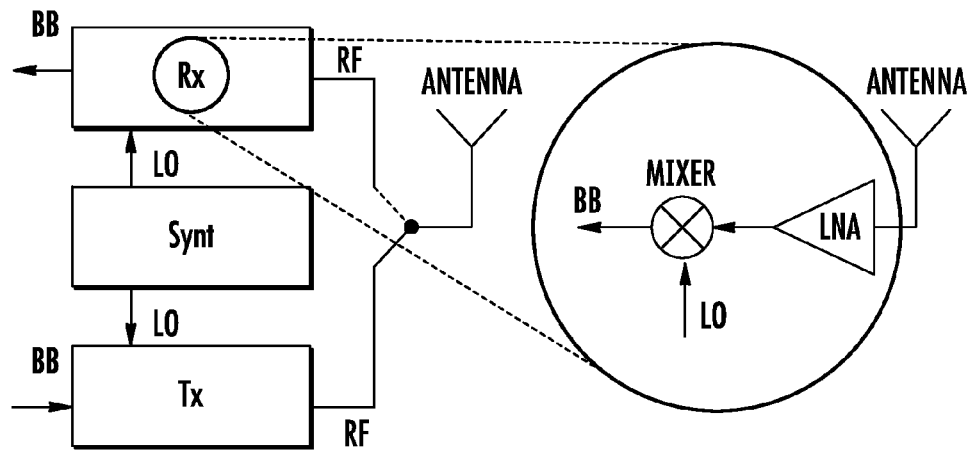
FIG. 1 depicts a basic transceiver, according to the prior art.
Figure 2:
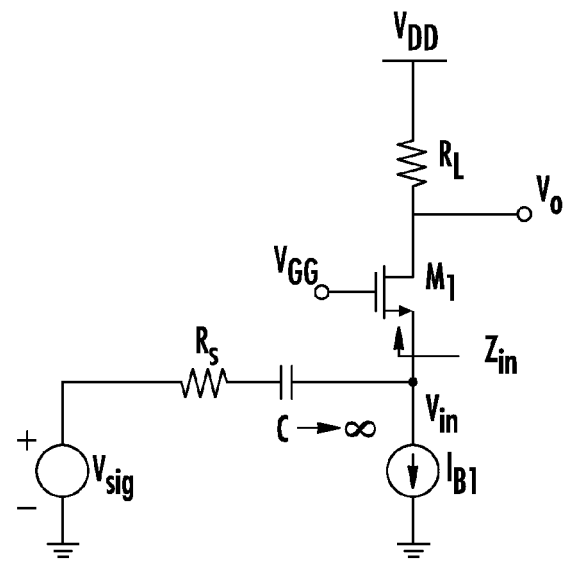
FIG. 2 shows a common gate amplification stage, according to the prior art.
Figure 3:
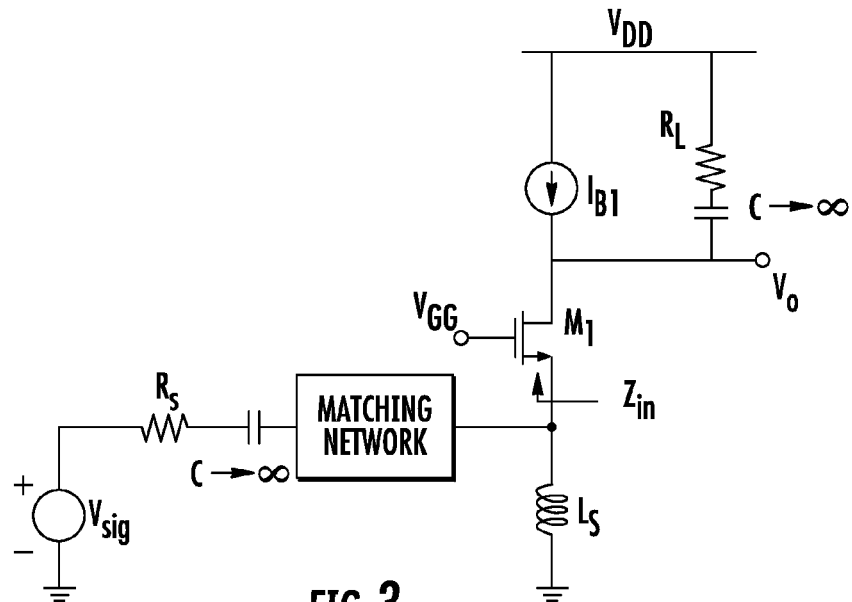
FIG. 3 shows another common gate amplification stage, according to the prior art.
Figure 4:
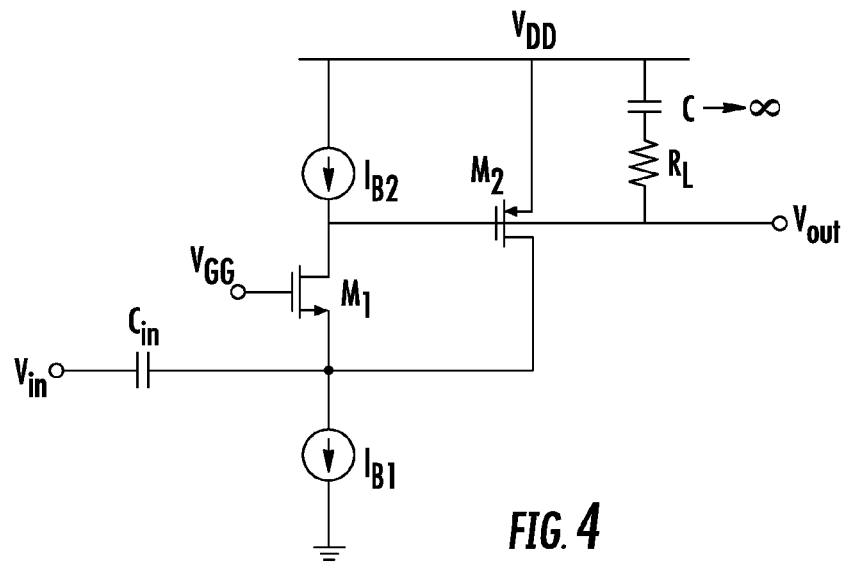
FIG. 4 shows the base topology of a radio-frequency amplifier, according to the present invention.
Figure 5:
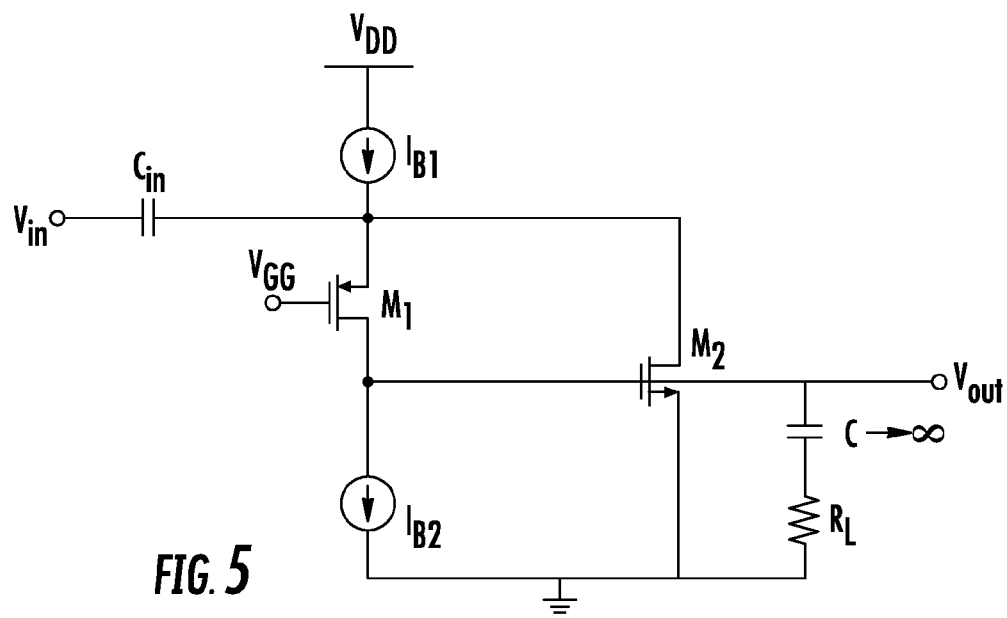
FIG. 5 shows a radio-frequency amplifier with a dual topology as shown in FIG. 4.

A basic scheme of the radio-frequency amplifier and its corresponding dual architecture are shown respectively in FIGS. 4 and 5. The DC component of the input signal is filtered out by the filter capacitor Cin and the filtered input signal is applied to the source of the N-type MOS transistor M1, through which a certain bias current $I_{B2}$ is forced and the gate of which is at a constant voltage $V_{GG}$ such to bias it in a saturation condition. The resistor $R_L$ is directly connected to the drain and capacitively decoupled such to not influence the determination of the bias point of the amplifier.

This resistor $R_L$ is purely optional and may be omitted. Indeed, the internal resistance of the current generator $I_{B2}$, that is finite, may have the same role of the resistance $R_L$. Differently from prior art architectures, the amplifier has a feedback transistor M2 of an opposite type with respect to the transistor M1, and has a gate-drain voltage equal to the difference between the output voltage Vout and the input AC signal to be amplified. This may be done as shown in the figures by connecting the drain of M1 with the gate of the P-type MOS transistor M2, that is connected through its drain to the source of M1, thus realizing a negative feedback loop. The bias current of M1 is imposed through the generator $I_{B2}$, and the bias current of M2 is univocally determined by difference from the current source $I_{B1}$.

From an analysis of the network in small signal conditions and by neglecting effects of parasitic capacitances, it results:

$$r_{in} \approx \frac{1}{g_{M1}g_{M2}R_L}$$

$$G_V \approx g_{M1} \square R_L$$

wherein $g_{M2}$ is the transconductance of the transistor M2 and $G_V$ is the gain of the radio-frequency amplifier.

The shown architecture has the same gain obtainable with the classic CG configuration, but with an input resistance reduced by the factor $g_{M2} \cdot R_L$, that is typically greater than 1. This allows obtainment of smaller input resistances and thus closer to the resistance of the antenna, with the same occupied silicon area and in low power consumption conditions.

Another advantage of the proposed configuration lies in the fact that, because of the feedback realized through the transistor M2, the imaginary component of the input impedance tends to be of an inductive type (that is the imaginary part is positive and increases when the frequency increases). This property allows to compensate the reactive part of the input impedance by an appropriate choice of the capacitor Cin, already present in the application as a filter of the DC component towards the antenna. In this way, the design is completely integrable and potentially applicable in a wide frequency range.

The proposed amplifier is intrinsically stable. Indeed, the open loop gain is:

$$\frac{\boxed{R_s} \square 1/g_{M1}[}{r_{in}}$$

By imposing the condition of maximum power transfer from the antenna to the amplifier, $r_{in}=R_S$, the loop gain is always smaller than 1.

Figure 6:
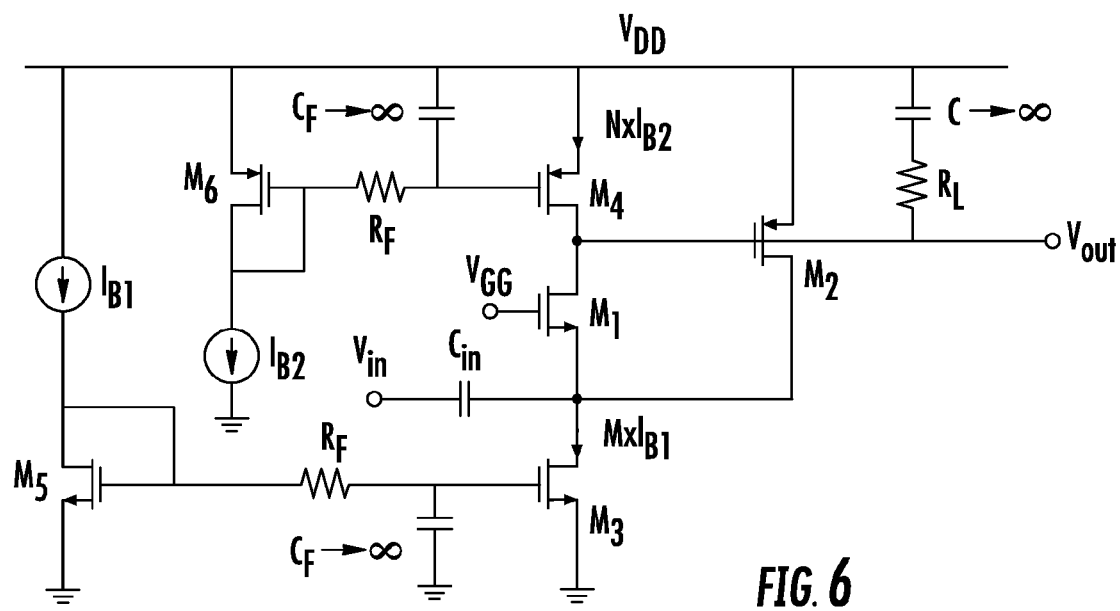
FIG. 6 shows a possible implementation of the base topology described in FIG. 4.
Figure 7:
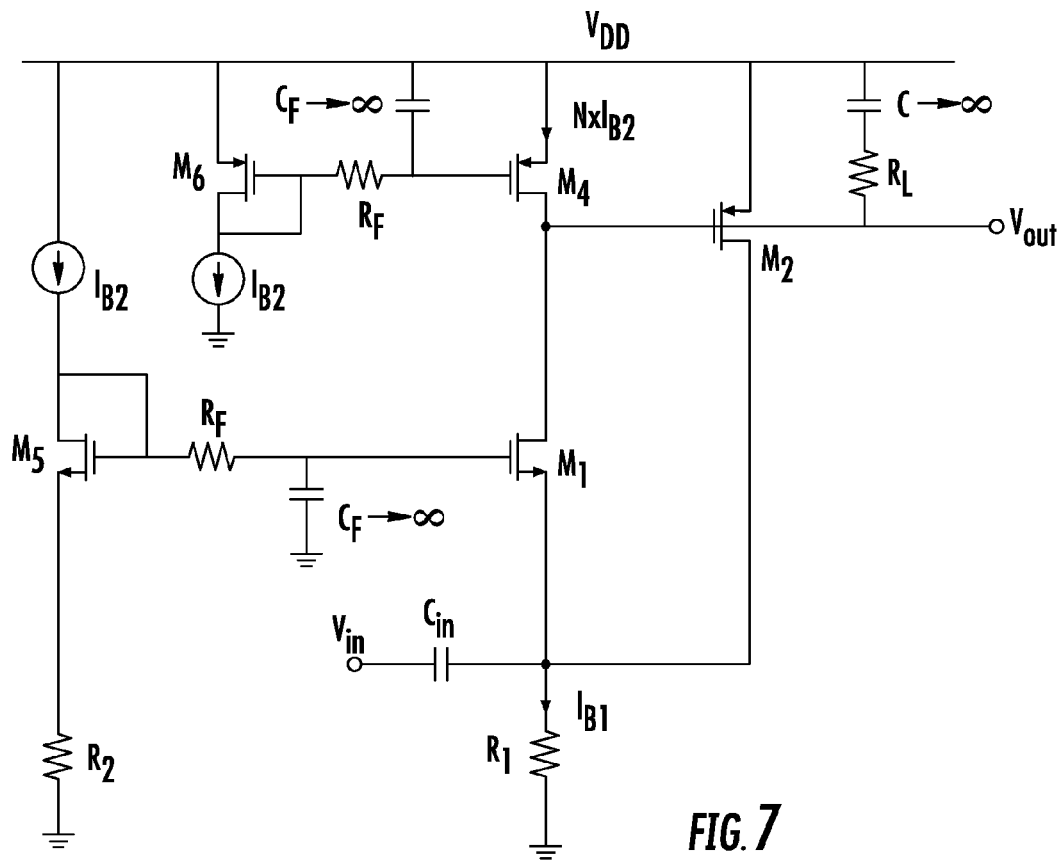
FIG. 7 depicts a possible variant of FIG. 6.
Figures from 8 to 10 depict graphs of the gain GAIN, of the return loss S11 and of the noise figure NF, respectively, of the amplifier of FIG. 6 vs. the frequency of the input signal.

As illustrated in the exemplary embodiment of FIG. 6, the generators $I_{B1}$ and $I_{B2}$ may be realized with simple current mirrors or, is the voltage swings allows it, with cascade or derived mirrors. As an alternative, it is possible to substitute the current generator $I_{B1}$ with a simple resistance, which theoretically is less noisy, and controlling the current that flows therethrough by means of a current mirror, as shown in the other exemplary embodiment of FIG. 7.

The pair of transistors M4-M6 is a first current mirror adapted to control the bias current imposed on M1. The mirror composed of the transistors M1-M5 together with the resistances R1 and R2, instead allows to determine univocally the current that flows through the resistor R1 and thus, by difference, the bias current of M2, according to the following formula:

$$I_{B1} = \frac{R_2 N I_{B2}}{R_1}$$

Figure 8:
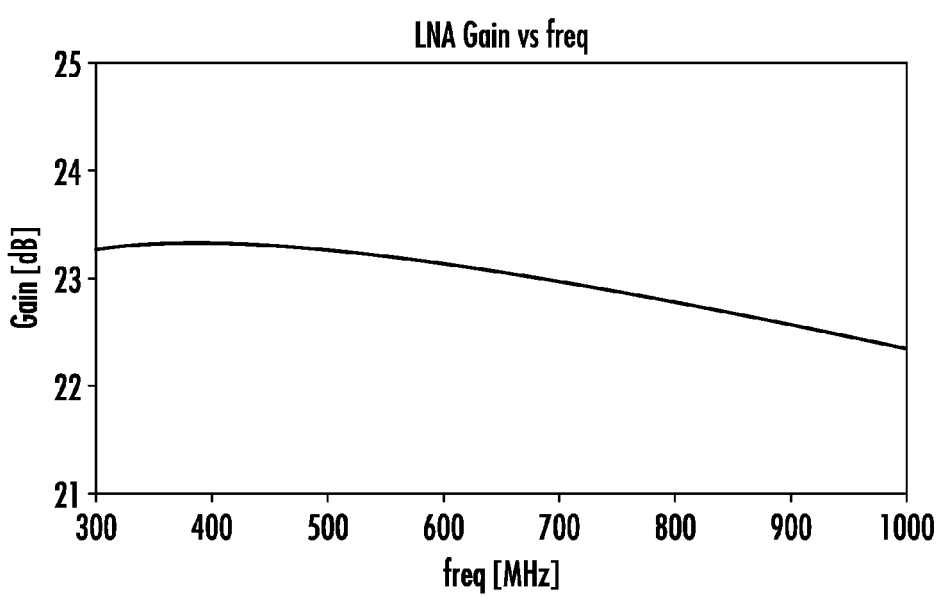
Figure 9:
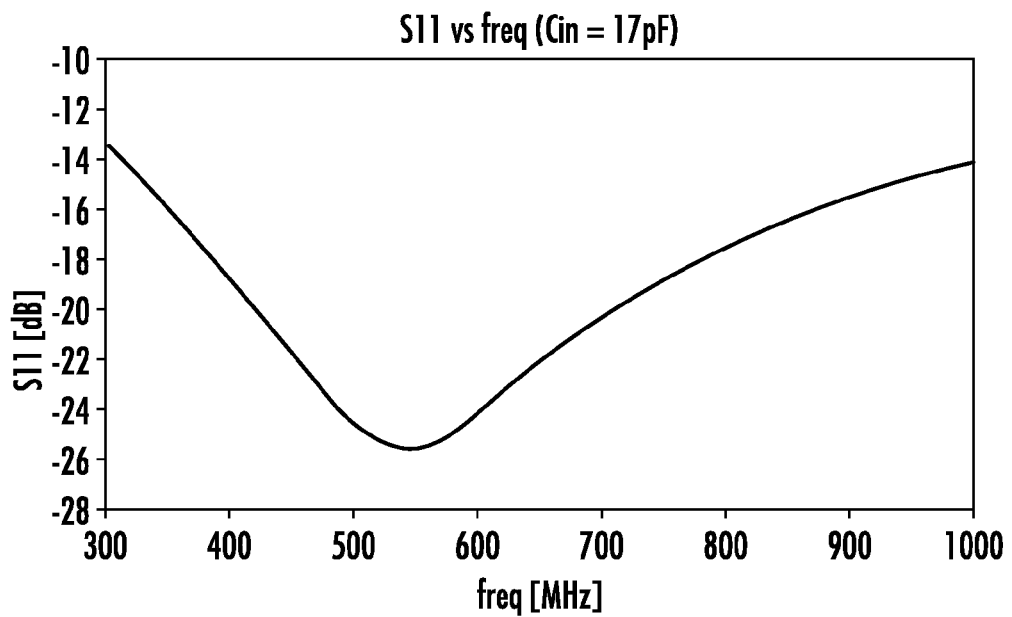
Figure 10:
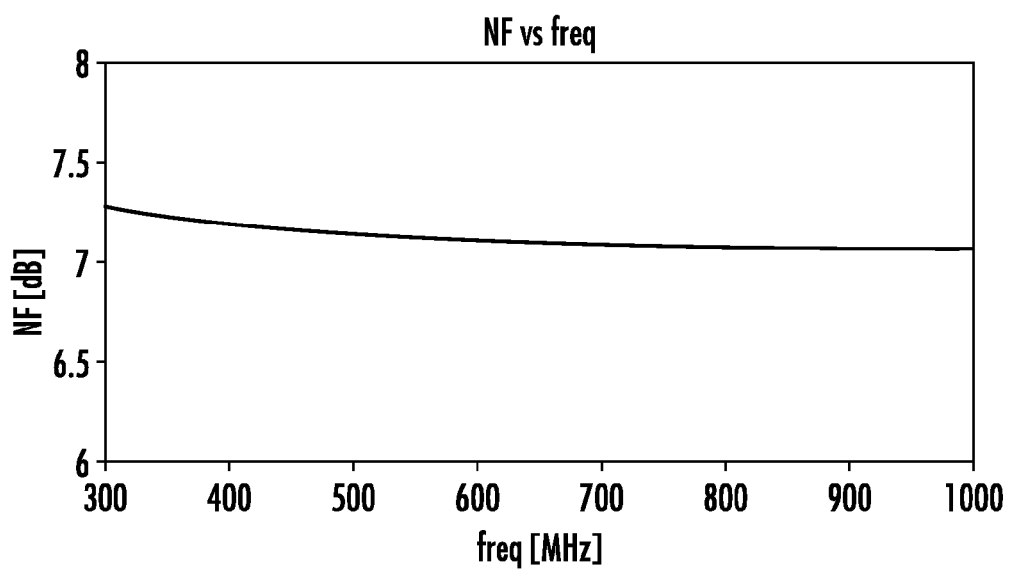

As an option, the noise performances of the radio-frequency amplifier may be improved by using RC filters, for example first-order filters, $R_F$ and $C_F$ in correspondence of the current mirrors or even of the gate node of the transistor M1. The functioning of the amplifier of FIG. 6, realized in 90 nm CMOS technology, supplied with a 1.2V voltage and biased with an overall current $I_{B1}$ of 400 μA. The graph representation of FIGS. 8 to 10, relative respectively to the gain GAIN, to the return loss S11 and to the noise figure NF vs. the frequency of the signal to be amplified, are in accordance with specifications that are typically imposed to radio-frequency amplifiers from 300 MHz up to 1 GHz.

The amplifier may be used as LNA in front end receivers for wireless applications. It is preferably realized in CMOS technology, though the illustrated architectures may be easily realized in BJT technology.

That which is claimed is:

1. A radio-frequency amplifier comprising:
    a common gate amplification stage comprising an amplification transistor having a control terminal, a drain terminal and a source terminal, and configured to be biased in a saturation condition with a first current and configured to receive an input signal as a gate-source voltage and to generate an output voltage as an amplified replica of the input signal; and
    a feedback transistor configured to be biased in a saturation condition with a second current and coupled to said common gate amplification stage so as to have a gate-drain voltage corresponding to a difference between the output voltage and the input signal; and
    a first generator coupled to the drain terminal of said common gate amplification stage and configured to generate the first current.

2. The radio-frequency amplifier of claim 1, further comprising an output terminal and an input terminal; further comprising a second generator configured to generate a sum of the first and second currents; and wherein said amplification transistor of said common gate amplification stage has the control terminal at a given potential, the drain terminal and a first line coupled thereto at a first supply voltage through said first generator, the drain terminal also coupled to said output terminal, and the source terminal and a second line coupled thereto at a second supply voltage through said second generator, the source terminal also coupled to said input terminal.

3. The radio-frequency amplifier of claim 1, further comprising an input terminal and an output terminal; further comprising a resistive element; and wherein said amplification transistor of said common gate amplification stage has a line coupled thereto at a first supply voltage through said first generator, the drain terminal also coupled to said output terminal, the source terminal and a line coupled thereto at a second supply voltage through said resistive element, the source terminal also coupled to said input terminal; and further comprising a diode-connected transistor having a source degeneration resistance forming a current mirror of unitary gain with said amplification transistor.

4. The radio-frequency amplifier of claim 2, wherein said first generator comprises:
two transistors forming a current mirror, each transistor having a control node; and
a R-C filter coupled between said control nodes of said two mirrored transistors and said line at the first supply voltage.

5. The radio-frequency amplifier of claim 2, wherein said second generator comprises:
two transistors forming a current mirror, each transistor having a control node; and
a R-C filter coupled between said control nodes of said two mirrored transistors and said line at the second supply voltage.

6. The radio-frequency amplifier of claim 3, further comprising a R-C filter connected between said control nodes of said amplification transistor and said diode-connected transistor and the line at the second supply voltage.

7. A radio-frequency amplifier comprising:
an output terminal and an input terminal;
a common gate amplification stage configured to be biased with a first current and configured to receive an input signal and to generate an output voltage as an amplified replica of the input signal; and
a feedback transistor configured to be biased with a second current and coupled to said common gate amplification stage so as to have a gate-drain voltage corresponding to a difference between the output voltage and the input signal;
a first generator configured to generate the first current;
a second generator configured to generate a sum of the first and second currents;
said common gate amplification stage comprising an amplification transistor having a control terminal at a given potential, a drain terminal and a line coupled thereto at a first supply voltage through said first generator, said drain terminal also coupled to the output terminal, and a source terminal and a second line coupled thereto at a second supply voltage through said second generator, said source terminal also coupled to the input terminal.

8. The radio-frequency amplifier of claim 7, wherein said generator of the first current comprises:
two transistors forming a current mirror, each transistor having a control node; and
a R-C filter coupled between said control nodes of said two mirrored transistors and the line at the first supply voltage.

9. The radio-frequency amplifier of claim 7, wherein said generator of the sum of the first and second currents comprises:
two transistors forming a current mirror, each transistor having a control node; and
a R-C filter coupled between said control nodes of said two mirrored transistors and the line at the second supply voltage.

10. A method of making a radio-frequency amplifier comprising:
configuring a common gate amplification stage comprising an amplification transistor having a control terminal, a drain terminal and a source terminal, and to be biased in a saturation condition with a first current and configuring the common gate amplification stage to receive an input signal as a gate-source voltage and to generate an output voltage as an amplified replica of the input signal;
configuring a feedback transistor to be biased in a saturation condition with a second current and coupling the feedback transistor to the common gate amplification stage so as to have a gate-drain voltage corresponding to a difference between the output voltage and the input signal and
configuring a first generator coupled to the drain terminal of the common gate amplification stage and configured to generate the first current.

11. The method of claim 10, wherein the amplification transistor of the common gate amplification stage has the control terminal at a given potential, the drain terminal coupled to a line at a first supply voltage through the first generator and to an output terminal, and the source terminal coupled to a second line at a second supply voltage through a second generator of a sum of the first and second currents and to an input terminal.

12. The method of claim 10, wherein the amplification transistor of the common gate amplification stage has the drain terminal coupled to a line at a first supply voltage through the first generator and to an output terminal, the source terminal coupled to a line at a second supply voltage through a resistive element and to an input terminal; and further comprises a diode-connected transistor having a source degeneration resistance forming a current mirror of unitary gain with the amplification transistor.

13. The method of claim 12, wherein the first generator comprises:
two transistors forming a current mirror, each transistor having a control node; and
a R-C filter coupled between the control nodes of the two mirrored transistors and the line at the first supply voltage.

14. The method of claim 12, wherein the second generator comprises:
two transistors forming a current mirror, each transistor having a control node; and
a R-C filter coupled between the control nodes of the two mirrored transistors and the line at the second supply voltage.

15. The method of claim 13, further comprising coupling an R-C filter between the control nodes of the amplification transistor and the diode-connected transistor and the line at the second supply voltage.

* * * * *